United States Patent
Takanashi et al.

(10) Patent No.: US 6,969,304 B2
(45) Date of Patent: Nov. 29, 2005

(54) METHOD OF POLISHING SEMICONDUCTOR WAFER

(75) Inventors: Kazuhito Takanashi, Fukushima (JP); Kiyoshi Suzuki, Fukushima (JP); Yoshinori Watanabe, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 218 days.

(21) Appl. No.: 10/344,660

(22) PCT Filed: Aug. 7, 2001

(86) PCT No.: PCT/JP01/06775

§ 371 (c)(1),
(2), (4) Date: Feb. 14, 2003

(87) PCT Pub. No.: WO02/15246

PCT Pub. Date: Feb. 21, 2002

(65) Prior Publication Data

US 2004/0043707 A1   Mar. 4, 2004

(51) Int. Cl.$^7$ ................................................ B24B 1/00
(52) U.S. Cl. ......................... 451/41; 451/59; 451/526
(58) Field of Search ........................... 451/41, 59, 526, 451/527, 528, 530, 533, 534, 537

(56) References Cited

U.S. PATENT DOCUMENTS 5,769,691 A     6/1998  Fruitman
6,283,836 B1    9/2001  Fruitman et al.
6,306,021 B1 *  10/2001 Masumura et al. ......... 451/287
6,589,106 B1 *  7/2003  Balmelle .................... 451/526

FOREIGN PATENT DOCUMENTS

| JP | 07-108454 A1 | 4/1995 |
| JP | 11-277408 A1 | 10/1999 |
| JP | 11-512976 A1 | 11/1999 |
| WO | 97/47433 A1 | 12/1997 |
| WO | 00/53370 A1 | 12/2000 |

OTHER PUBLICATIONS

International Search Report on PCT/JP01/06775 mailed on Nov. 13, 2001.
International Preliminary Examination Report mailed on Apr. 4, 2003.

* cited by examiner

Primary Examiner—Dung Van Nguyen
(74) Attorney, Agent, or Firm—Rader, Fishman & Grauer PLLC (57) ABSTRACT

There is provided a method for polishing a semiconductor wafer, in which by using a specific polishing cloth as one for use in a mirror polishing step for the semiconductor wafer, especially in a final polishing stage thereof, generation of micro-scratches and blind scratches on a wafer surface is prevented. In a polishing step of mirror polishing the semiconductor wafer using a polishing cloth, the polishing is performed using the polishing cloth with a nap layer of 500 μm or more in thickness.

6 Claims, 7 Drawing Sheets

METHOD OF POLISHING SEMICONDUCTOR WAFER

TECHNICAL FIELD

The present invention relates to a method for polishing a semiconductor wafer (hereinafter also simply referred to as a wafer), in which by using a specific polishing cloth as one for use in a mirror polishing step for the semiconductor wafer, especially in a final polishing stage thereof, there is prevented generation of micro-scratches and blind scratches on a wafer surface.

BACKGROUND ART

A manufacturing process for a semiconductor wafer includes the following steps: a slicing step of slicing thin plates (wafers) from a single crystal ingot, and other steps such as chamfering a wafer, lapping, etching, polishing, and cleaning.

A chemical etched wafer surface is processed in a mirror polishing into a mirror-surface having smoothness without strain. Mirror polishing of a silicon wafer is conducted while giving a prescribed load and a relative speed between the wafer and the polishing cloth, and supplying a polishing agent. As the polishing agent there is mainly used one prepared by dispersing colloidal silica or the like into an alkaline solution.

There is generally adopted as the polishing step a multi-stage polishing step of two or more stages including a coarse polishing stage (generally called a stock polishing stage) with the purpose of flattening, a final polishing stage with the purposes of improvement in surface roughness and elimination of polishing scratches and other type polishing.

In the stock polishing stage, there are used a hard polishing cloth (a velour type) obtained by impregnating a foamed urethane sheet, a non-woven fabric such as polyester or the like with urethane resin, and a high-performance polishing agent added with a polishing accelerator.

In the final polishing stage, there are used a suede like polishing cloth (a suede type) of two layers obtained by foaming urethane resin on a base cloth of a non-woven fabric, a polishing agent added with additives for control of cloudiness on a wafer surface called haze observed under a collimated light, and other requirements.

Figure 1:
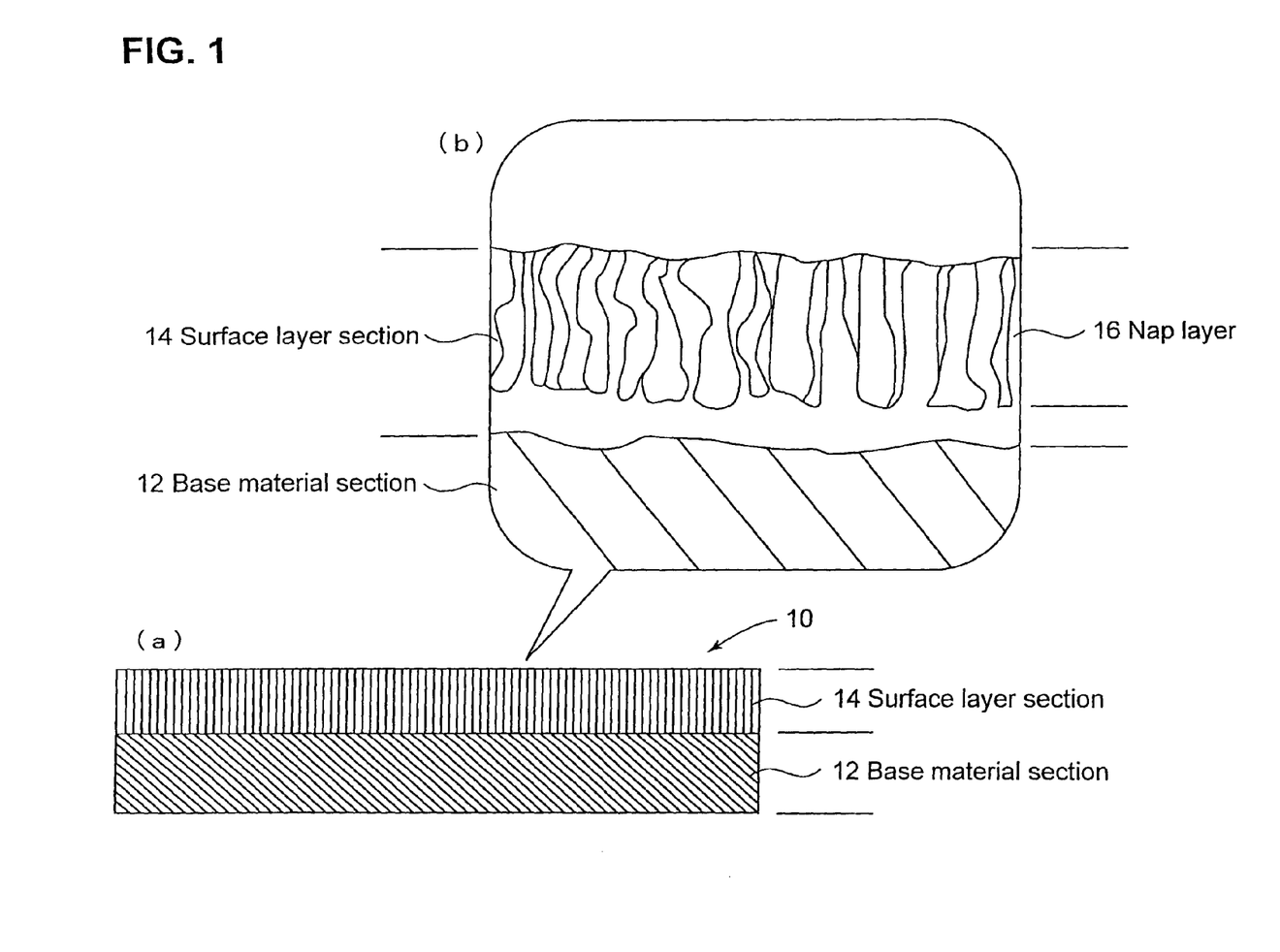
FIG. 1 is a view showing an embodiment of a polishing cloth used in the method of the present invention.

Especially, detailed description will be given of a suede type polishing cloth used in the final polishing stage. As shown in FIG. 1, the polishing cloth is formed such that a base material of polyester felt impregnated with polyurethane is coated (laminated) with polyurethane and a foamed layer is grown in the polyurethane, followed by removal of a surface section thereof to form the foamed layer with pores. This layer is called a nap layer. There is provided a sort of standard on a thickness or a length of the nap layer, whereas it is generally used over a range of a value on the order of 450 $\mu$m.

There have been occasionally generated on a surface of a final polished wafer micro-scratches and blind scratches that are considered to be caused by polishing. By generation of such scratches, there arises a problem that product yield decreases in a device fabrication process and other processes.

Herein, a micro-scratch (may be referred to as a polishing slight scratch) on a wafer surface is a very small polishing scratch to be counted at 0.10 $\mu$m or less in particle diameter with a particle counter.

Further, a blind scratch on a wafer surface is a defect (damage) that cannot be observed in ordinary appearance inspection and evaluated with a method wherein a wafer is subjected to preferential etching, followed by observation.

DISCLOSURE OF THE INVENTION

The present invention has been made in light of the above problem in the prior art and it is an object of the present invention to provide a method for polishing a semiconductor wafer, in which by using a specific polishing cloth as one for use in a mirror polishing step for a semiconductor wafer, especially in a final polishing stage thereof, there is prevented generation of micro-scratches and blind scratches on a wafer surface.

In order to solve the above problem, a method for polishing a semiconductor wafer according to the present invention comprises a polishing step of mirror polishing the semiconductor wafer using a suede type polishing cloth, wherein the polishing is performed using the polishing cloth with a nap layer of 500 $\mu$m or more in thickness.

A sort of standard has hitherto been available for a thickness of the nap layer (a nap length) but severe control has not especially been applied thereto; the polishing has generally been performed with the nap length of about 450 $\mu$m. The inventors have conducted a research aiming at a relationship between a nap length and generation of micro-scratches and blind scratches, with new findings that making short of the nap length leads to generation of micro-scratches and blind scratches, but, in contrast with this, the nap length of 500 $\mu$m or more leads to almost no generation thereof.

This is considered because by making longer the nap length, a wafer is polished while keeping elasticity of a surface layer of a final polishing cloth which is brought into direct contact with the wafer at a more proper level than before, or fine particles of impurities that can be a cause for scratches are captured perfectly within the longer nap layer; generation of the scratches is suppressed.

Figure 2:
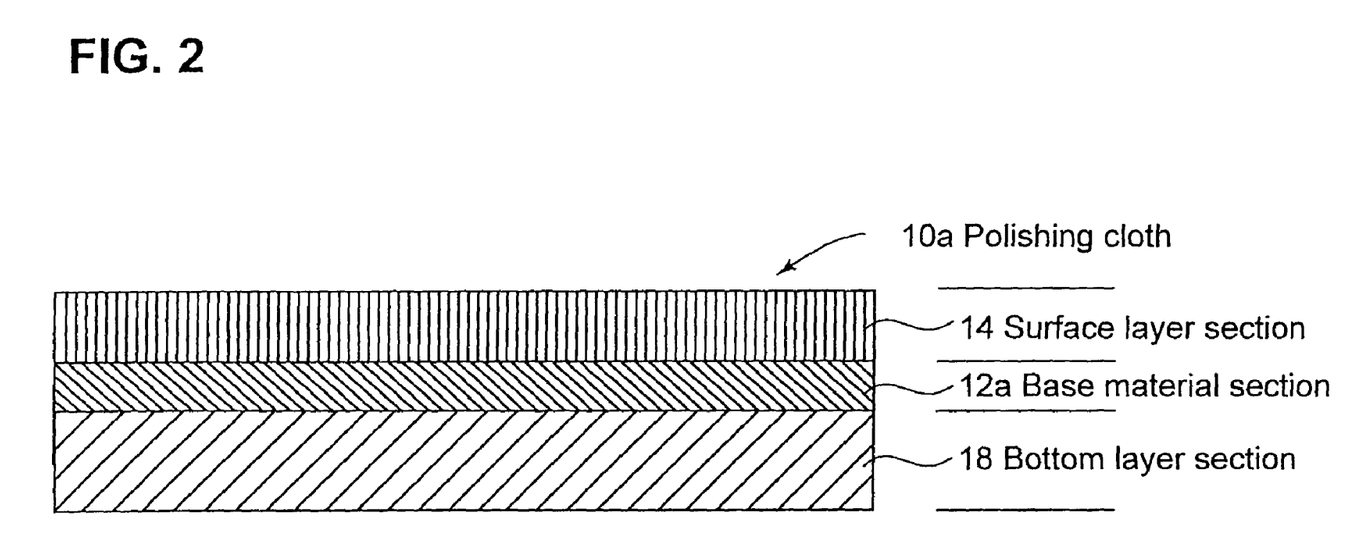
FIG. 2 is a schematic sectional view showing another embodiment of a polishing cloth used in the method of the present invention.

Further, it is preferable that, as a structure of the polishing cloth, it is a suede type polishing cloth constituted of two layers of a base material section made of a non-woven fabric and a surface layer section having a nap layer made of urethane (FIG. 1), or it is a suede type polishing cloth of a three layer structure constituted of a base material section made of a hard plastic sheet, a surface layer section having a nap layer made of urethane and a bottom layer section made of an elastic sheet adhered to a bottom surface of the base material section (FIG. 2). The latter polishing cloth of the three layers not using a non-woven fabric as a base material is especially preferable.

In the above polishing cloth of the three layers, as the hard plastic sheet, there can be used plastic classified in a category of a relatively hard type such as polyethylene terephthalate (PET), polyimide, polyethylene or polyurethane. Further, as the elastic sheet, there can be preferably used a sponge-like rubber elastic material such as foamed silicone rubber or foamed urethane rubber. When using such a polishing cloth, by making longer the nap length, with almost no generation of micro-scratches and blind scratches, there is suppressed propagation of waviness of the polishing cloth, especially waviness of the bottom layer section thereof, to the surface section caused by horizontal force during processing, and there is improved non-uniformity in an amount of stock removal caused by sori (bow or warp) and waviness of the wafer itself so as to upgrade an ability to maintain flatness on the whole wafer; there is obtained a mirror polished wafer in which a peripheral sag is prevented, and which is excellent in flatness and surface roughness.

As a polishing stage using the above polishing cloths, a final polishing stage is preferable. The term "final polishing" used in the present invention means polishing in the final stage of the polishing step including plural polishing stages. While polishing using a polishing cloth having a nap layer is considered to be applied to other than the final polishing stage, by applying the polishing method of the present invention to a final polishing stage, micro-scratches (polishing slight scratches) caused in the final polishing stage can be prevented.

The reason why a nap length of a polishing cloth used in the method of the present invention is set to be 500 µm or more is that it has been found that with a polishing cloth with such a nap length, signals (micro-scratches) of 0.10 µm or less greatly decreases in evaluation with a particle counter and it has also become clear that with a polishing cloth with a nap length of 500 µm or more, generation of micro-scratches caused by processing can be prevented. While the upper limit of the nap length is not specifically limited, it is hard to make a polishing cloth with an excessively long nap length; therefore, it is considered that the upper limit of the nap length is about 600 µm under the present circumstances.

BEST MODE FOR CARRYING OUT THE INVENTION

Description will be given of structural embodiments of a polishing cloth used in a method for polishing a semiconductor wafer of the present invention with FIGS. 1 and 2 and further description will be given of a constructional embodiment of a polishing apparatus with FIG. 3.

Figure 3:
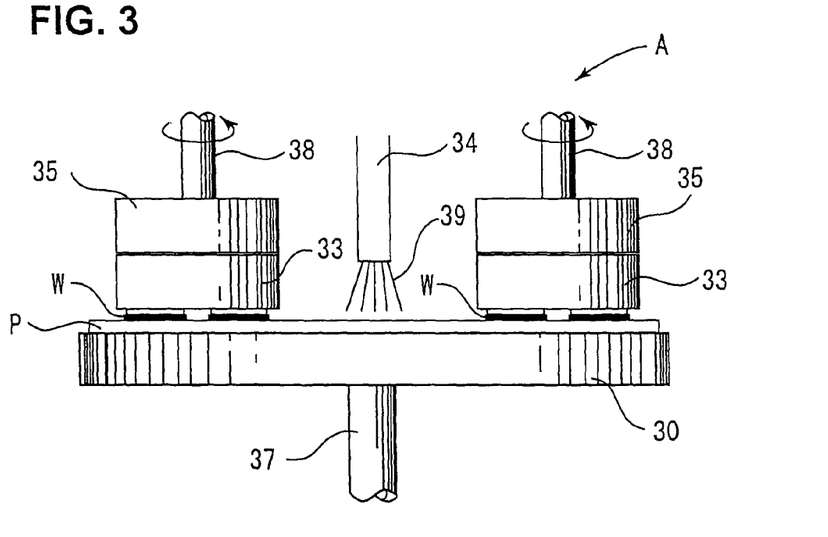
FIG. 3 is an explanatory side view showing an embodiment of a polishing apparatus used in the method of the present invention.

Polishing slight scratches and blind scratches are observed in a final polishing stage of batch processing, a CMP final polishing stage of single wafer processing and others, and construction of an apparatus used in the final polishing stages, that is a polishing apparatus, is not limited to the embodiment of the apparatus shown in FIG. 3.

FIG. 1 is a view showing an embodiment of a polishing cloth used in the method of the present invention, wherein part (a) is a schematic sectional view and part (b) is an enlarged schematic sectional view. In FIG. 1, reference numeral 10 designates a polishing cloth used in the method of the present invention, which is of a two layer structure of a base material section 12 and a surface layer section 14 provided on the top surface of the base material section 12.

The base material section 12 is made of a non-woven fabric and the surface layer section 14 has a nap layer 16 made of urethane. In the polishing method of the present invention, it is necessary that a thickness of the nap layer 16 is 500 µm or more.

FIG. 2 is a schematic sectional view showing another embodiment of a polishing cloth used in the method of the present invention. In FIG. 2, reference numeral 10a designates a polishing cloth used in the method of the present invention, which has a base material section 12a and a surface section member 14 provided thereon as in FIG. 1, and in addition, a bottom layer section 18 provided on the bottom surface of the base material section 12a, and is characterized by the above-mentioned three layer structure.

The base material section 12a is composed of a thin rigid film made of hard plastic or the like and the surface layer section 14 has a nap layer 16 made of urethane as in the embodiment shown in FIG. 1. The bottom layer section 18 is made of an elastic sheet adhered to the bottom surface of the base material section 12a. In the structural embodiment of FIG. 2 as well, it is necessary that a thickness of the nap layer 16 is 500 µm or more.

In order to perform the method for polishing a semiconductor wafer of the present invention, there can be applied a known polishing apparatus such as a polishing apparatus as shown in FIG. 3. FIG. 3 shows an embodiment of a batch polishing apparatus and the polishing apparatus (A) has a polishing turn table 30 to be rotated at a prescribed rotation rate by a rotary shaft 37. A polishing cloth (P) is adhered on the top surface of the polishing turn table 30.

Reference numeral 33 designates a work holding plate, which is rotated by a rotary shaft 38 through a top load 35. With plural wafers W being held on the bottom surface of the work holding plate 33 by means of adhesion, the wafers are pressed down onto the top surface of the polishing cloth (P), and at the same time a polishing agent solution (slurry) 39 is supplied onto the polishing cloth (P) at a prescribed rate through a polishing agent supply pipe 34 from a polishing agent supply apparatus (not shown), the wafers (W) being polished in such a way that the surfaces of the wafers (W) to be polished are rubbed with the surface of the polishing cloth (P) through the polishing agent. In the method of the present invention, as the polishing cloths (P), there are used the polishing cloths 10 and 10a as shown in FIGS. 1 and 2.

In a single wafer polishing apparatus as well, a fundamental construction thereof is the same as the above-mentioned batch one. The point different from the batch polishing apparatus is that the single wafer polishing apparatus has a single wafer head as a wafer holding member and polishing is performed with one wafer being held by the single wafer head.

Further detailed description will be given of the present invention taking up examples. The examples are shown by way of illustration and it is needless to say that the examples should not be construed by way of limitation.

COMPARATIVE EXAMPLES 1 AND 2

There were polished 8 inch epitaxial wafers (hereinafter may be referred to as an epi wafer) having an epitaxial layer of 10 μm in thickness with a single wafer CMP final polishing apparatus. Conditions for final polishing were as follows: a polishing pressure of 200 g/cm$^2$, a relative speed of 50 m/min and an amount of stock removal of 0.1 μm. An alkaline solution (pH=10) containing colloidal silica was used as a polishing agent.

There was used as a polishing cloth a final polishing cloth of a three layer structure as shown in FIG. 2. To be concrete, the polishing cloth was of a three layer structure constituted of a base material section made of a hard plastic sheet of ployethylene terephthalate (in these comparative examples, a sheet of 188 μm in thickness was used, which is hereinafter referred to as #188PET); a surface layer section FS-3 (a trade name, made by Daiichi Lace K.K.) having a nap layer of 420 μm (Comparative Example 1) or 470 μm (Comparative Example 2); and further a bottom layer section adhered on the bottom surface of the base material section of the polishing cloth made of an elastic sheet HN-400 (a trade name, made by Sunpolymer Co., Ltd.) (the polishing cloth is hereinafter referred to as FS-3/#188PET/HN-400).

A thickness of the nap layer was confirmed in observation of a sectional view of the polishing cloth with scanning electron microscopes S-4000 and 4160 (trade names, made by Hitachi, Ltd.)

Micro-scratches (polishing slight scratches) on a wafer surface were evaluated each as a very small scratch to be counted as one with a particle diameter of 0.1 μm or less using a particle counter LS-6500 (a trade name, made by Hitachi Electronics Engineering Co., Ltd.)

Blind scratches were observed in appearance inspection on a wafer under a collimated light after the wafer was immersed for one minute in a mixed acid solution (JIS H 0609-B solution) with a mixing ratio of 50 wt % HF:61 wt % HNO$_3$:100 wt % CH$_3$COOH:H$_2$O=1:15:3:3 (by volume).

Figure 4:
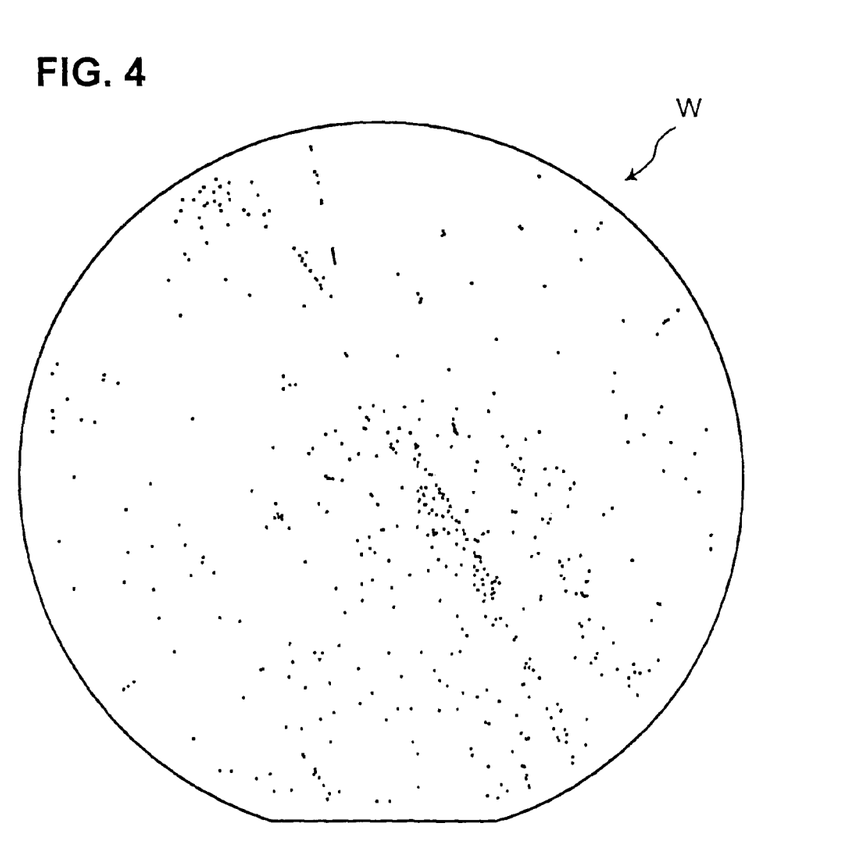
FIG. 4 is a top plan view of a polished wafer showing a generation state of polishing micro-scratches in Comparative Example 1.
Figure 5:
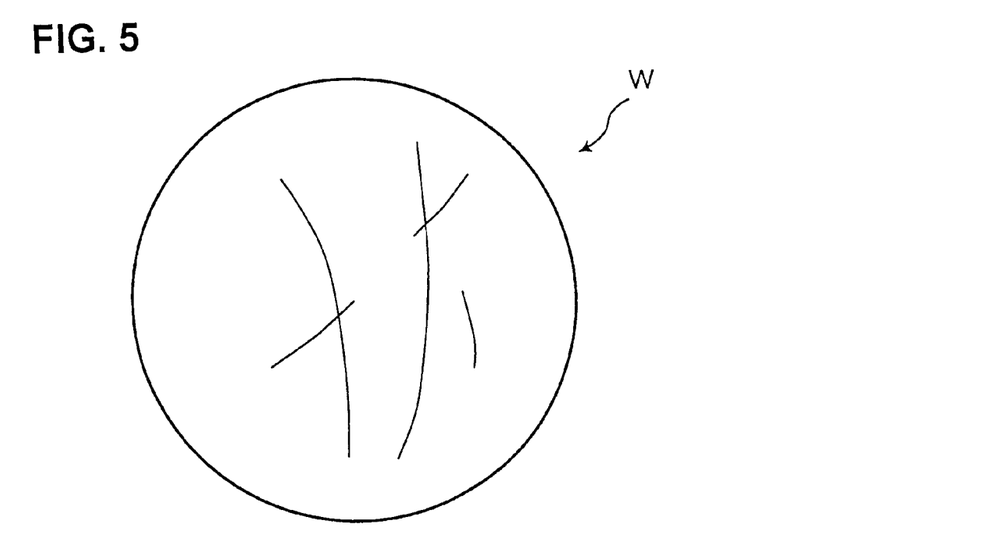
FIG. 5 is a top plan view of a polished wafer showing a generation state of blind scratches in Comparative Example 1.

In Comparative Examples 1 and 2 (FS-3/#188PET/HN-400), polishing micro-scratches and blind scratches were generated together, though these scratches were small in number. Typical polishing results of a wafer (W) (results of Comparative Example 1) are shown in FIG. 4 (polishing micro-scratches) and FIG. 5 (blind scratches). The count number of polishing micro-scratches (0.10 μm to 0.09 μm in particle diameter) in FIG. 4 was 338. Note that in the figure, micro-scratches of 0.10 μm or more in particle diameter are plotted.

EXAMPLES 1 AND 2

Using polishing cloths each with a structure similar to those of Comparative Examples 1 and 2, in which surface layer sections FS-3 of the suede type final polishing cloths were replaced by FS-7 (a trade name, made by Daiichi Lace K.K.) having a nap layer of 520 μm (Example 1) and FS-7 having a nap layer of 70 μm (Example 2), respectively, to form three layer structures of FS-7/#188PET/HN-400, polishing was performed in the same conditions and with the same polishing agent as in Comparative Examples 1 and 2.

Figure 6:
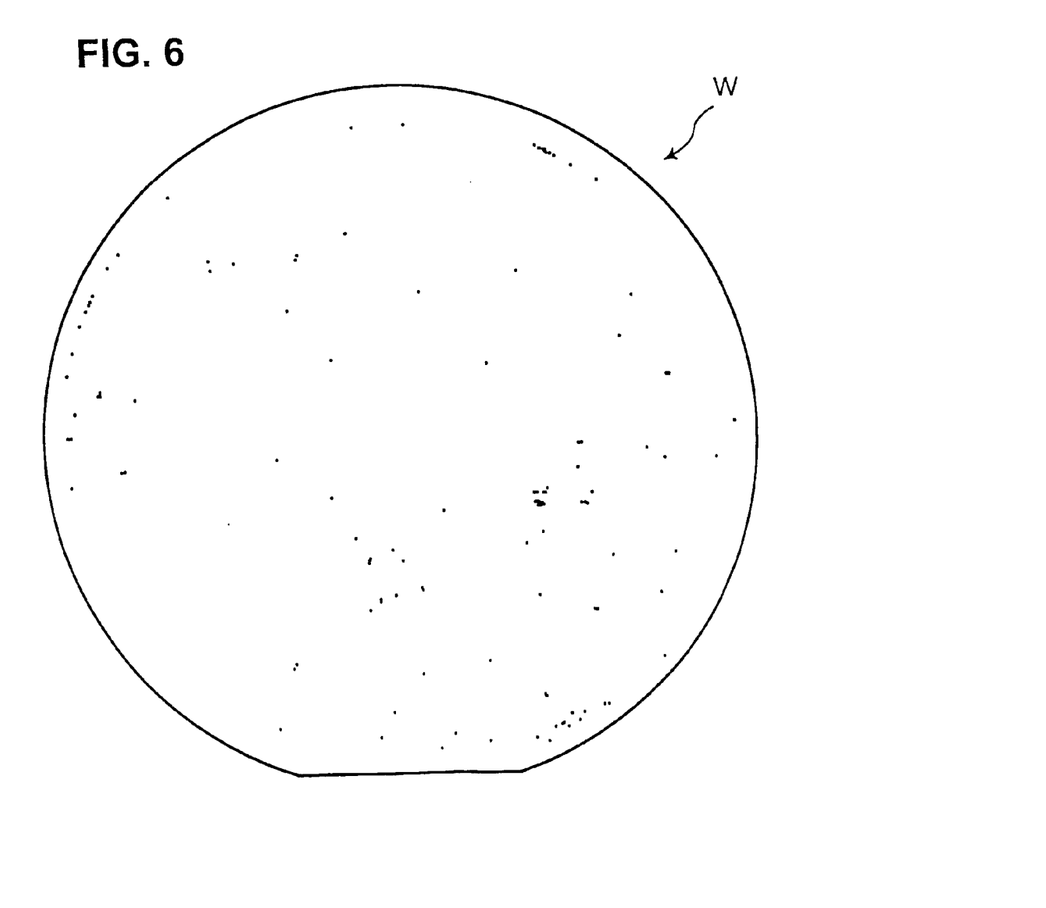
FIG. 6 is a top plan view of a polished wafer showing a generation state of polishing micro-scratches in Example 1.
Figure 7:
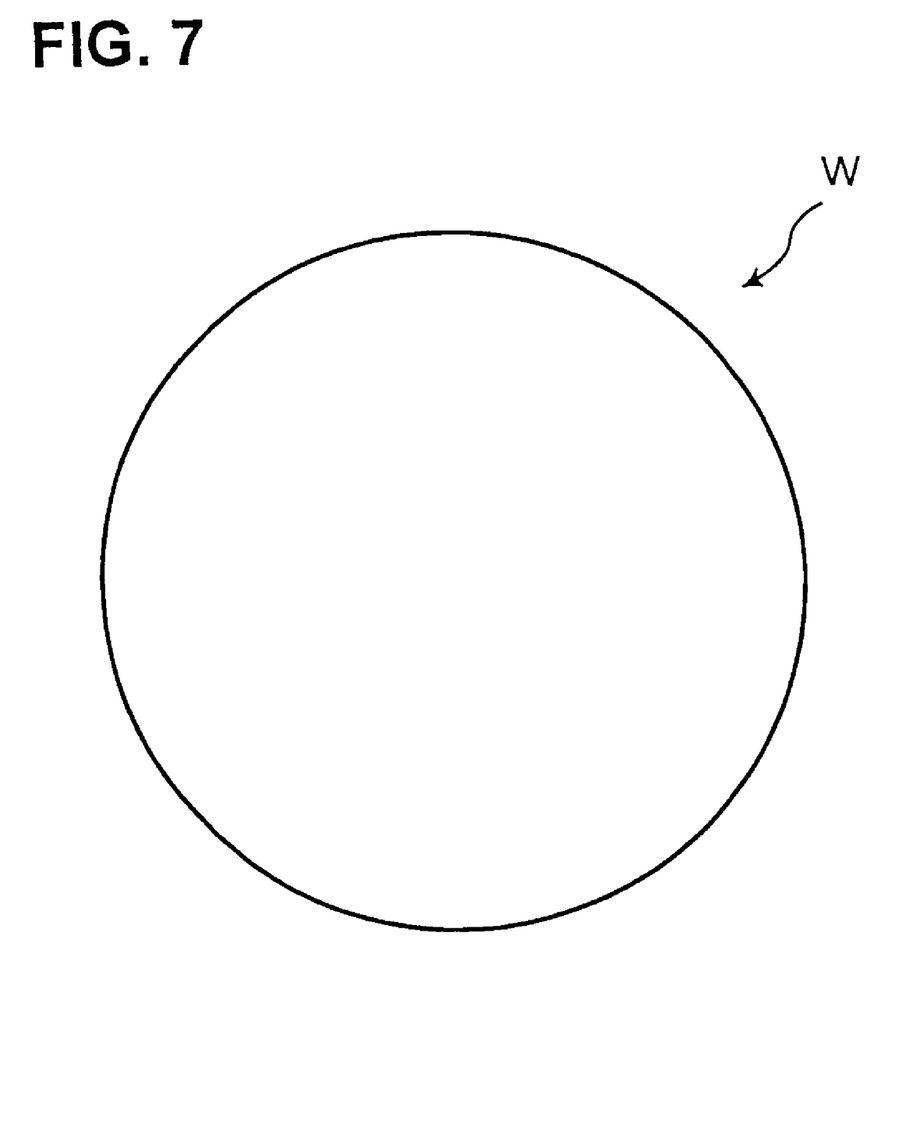
FIG. 7 is a top plan view of a polished wafer showing a generation state of blind scratches in the Example 1.

In Examples 1 and 2, polishing micro-scratches and blind scratches were hardly generated. Typical polishing results of a wafer (W) (results of Example 1) are shown in FIG. 6 (polishing micro-scratches) and FIG. 7 (blind scratches). Note that the count number of polishing micro-scratches (0.10 μm to 0.09 μm in particle diameter) in FIG. 6 was 74.

Figure 8:
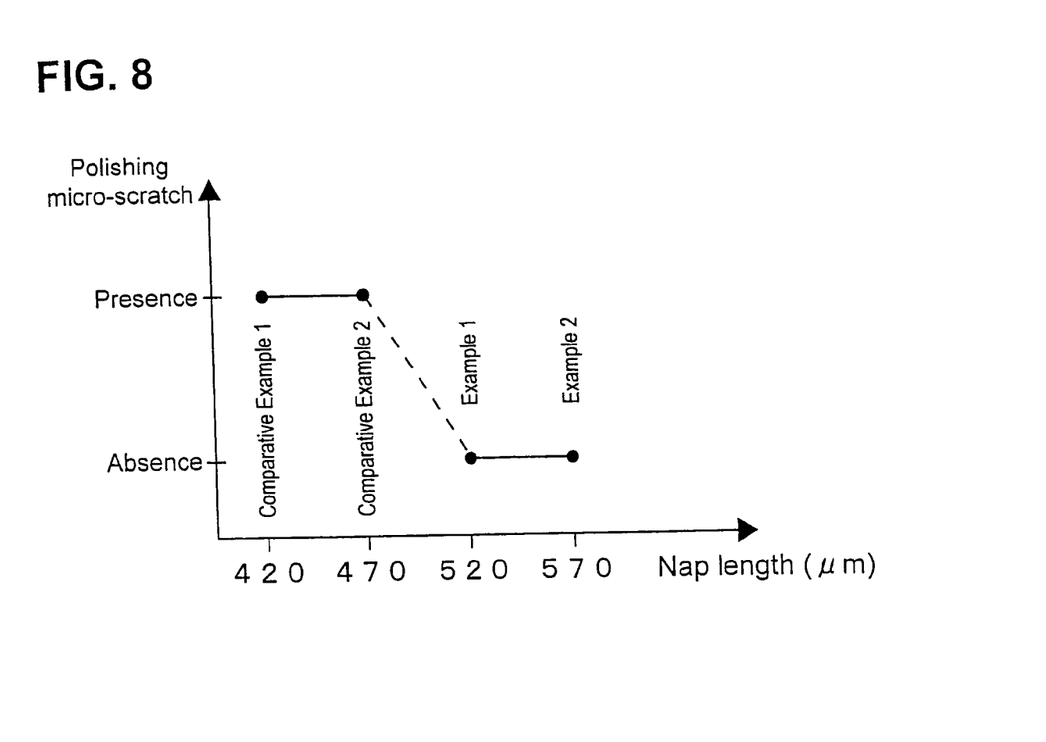
FIG. 8 is a graph showing a relationship between a nap length and a polishing micro-scratch.
Figure 9:
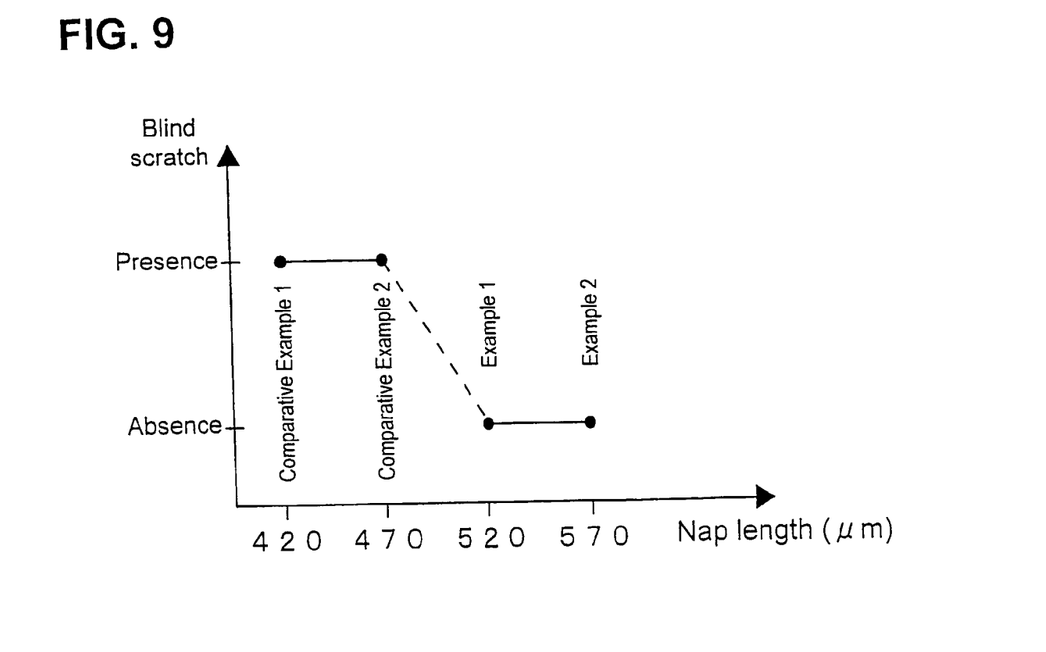
FIG. 9 is a graph showing a relationship between a nap length and a blind scratch.

The results of Comparative Examples 1 and 2 (FS-3/#188PET/HN-400) and the results of Examples 1 and 2 (FS-7/#188PET/HN-400) are shown graphically in FIGS. 8 and 9, respectively. Herein, the presence or absence of polishing micro-scratches of FIG. 8 was determined such that the absence was indicated when the count number on polishing micro-scratches of 0.10 μm or less was 100 or less, while the presence was indicated when the count number was more than 100. Further, with respect to blind scratches of FIG. 9, the presence was indicated when any streak-like scratches were recognized in appearance inspection.

COMPARATIVE EXAMPLES 3 AND 4

There were polished 8 inch epi wafers (10 μm in epi thickness) with a batch final polishing apparatus. A final polishing cloth was of a two layer structure constituted of a non-woven fabric and a polyurethane layer as shown in FIG. 1, which was a polishing cloth Seagull 7355FM (a trade name, made by Daiichi Lace K.K.) having a nap layer of 400 μm (Comparative Example 3) or of 450 μm (Comparative Example 4).

Figure 10:
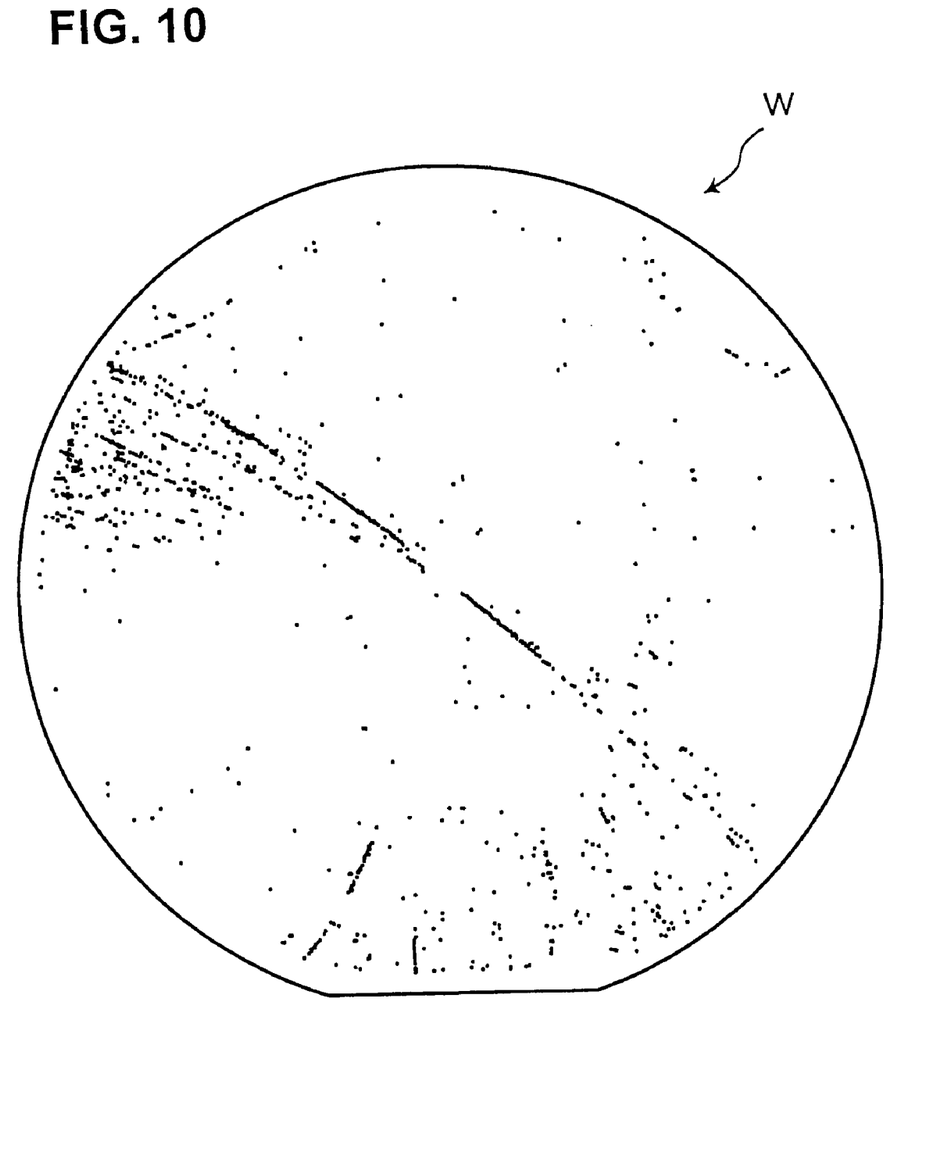
FIG. 10 is a top plan view of a polished wafer showing a generation state of polishing micro-scratches in Comparative Example 3.

In Comparative Examples 3 and 4, micro-scratches on each wafer surface were evaluated in a manner similar to Comparative Examples 1 and 2 and as a result, micro-scratches were observed over all the surface of each wafer. Typical polishing results of a wafer (W) (results of Comparative Example 3) are shown in FIG. 10 (polishing micro-scratches). The count number of polishing micro-scratches (0.10 μm to 0.09 μm in particle diameter) was 827. Further, in Comparative Examples 3 and 4, blind scratches were observed on the wafer surface in a similar manner to FIG. 5.

EXAMPLES 3 AND 4

Using polishing cloths each of a structure similar to those of Comparative Examples 3 and 4 (the two layer polishing cloth of FIG. 1), in which nap layers were changed to one of 530 μm (Example 3) and another of 550 μm (Example 4), respectively, wafers were polished in a manner similar to Comparative Examples 3 and 4.

As a result, micro-scratches (polishing slight scratches) and blind scratches on a wafer surface were hardly observed when both the above polishing cloths were used.

EXAMPLE 5

A batch polishing apparatus similar to the apparatus used in Comparative Examples 3 and 4 was used and a polishing cloth of a three layer structure was adopted as a final polishing cloth.

As the three layer polishing cloth, FS-7/#188PET/HN-400 having a nap layer of 570 μm (similar to Example 2) was used.

As a result, micro-scratches and blind scratches on a wafer surface were not observed. Further, flatness in a peripheral portion of each wafer was better than when the two layer polishing cloth was used.

As described above, it has been found that there can be prevented generation of polishing micro-scratches (slight scratches) and blind scratches on a wafer surface depending on a length of a nap layer, regardless of types of polishing apparatus (a batch type or a single wafer type), and independently of types of polishing cloths such as a two layer one or a three layer one. Especially, it is effective to use a final polishing cloth with a nap length of 500 μm or more.

Note that the present invention is not limited to description of the above embodiments or examples. The above embodiments and examples are simply intended to be illustrations and it is needless to say that any of modifications or alterations is included in the technical scope of the present invention as far as those have substantially the same construction, function and effect as the technical scope of the present invention.

CAPABILITY OF EXPLOITATION IN INDUSTRY

As described above, according to the method of the present invention, a great effect can be achieved that by using a specific polishing cloth as one for use in a mirror polishing step for a wafer, especially in a final polishing stage thereof, there can be stably manufactured a wafer on a surface of which micro-scratches and blind scratches are not generated.

What is claimed is:

1. A method for polishing a semiconductor wafer comprising a polishing step of mirror polishing the semiconductor wafer using a polishing cloth, wherein the polishing is performed using the polishing cloth with a nap layer in a range of 500 to 600 µm in thickness, and wherein the polishing prevents the generation of micro-scratches and blind scratches on a wafer surface.

2. The method for polishing a semiconductor wafer according to claim 1, wherein the polishing cloth is constituted of two layers of a base material section made of a non-woven fabric and a surface layer section having a nap layer made of urethane.

3. The method for polishing a semiconductor wafer according to claim 2, wherein the polishing step of mirror polishing the semiconductor wafer using the polishing cloth is a final polishing step.

4. The method for polishing a semiconductor wafer according to claim 1, wherein the polishing cloth is of a three layer structure constituted of a base material section made of a hard plastic sheet, a surface layer section having a nap layer made of urethane and a bottom layer section made of an elastic sheet adhered to a bottom surface of the base material section.

5. The method for polishing a semiconductor wafer according to claim 4, wherein the polishing step of mirror polishing the semiconductor wafer using the polishing cloth is a final polishing step.

6. The method for polishing a semiconductor wafer according to claim 1, wherein the polishing step of mirror polishing the semiconductor wafer using the polishing cloth is a final polishing step.

* * * * *